US007317364B2

(12) United States Patent
Shih et al.

(10) Patent No.: US 7,317,364 B2
(45) Date of Patent: Jan. 8, 2008

(54) VARACTOR TUNING FOR A NARROW BAND FILTER INCLUDING AN AUTOMATICALLY CONTROLLED TUNING SYSTEM

(75) Inventors: Chien-Fu Shih, Sunnyvale, CA (US); Yongming Zhang, San Diego, CA (US); Brian H. Moeckly, Palo Alto, CA (US)

(73) Assignee: Conductus, Inc., Sunnyvale, CA (US)

( * ) Notice: Subject to any disclaimer, the term of this patent is extended or adjusted under 35 U.S.C. 154(b) by 0 days.

(21) Appl. No.: 11/484,254

(22) Filed: Jul. 11, 2006

(65) Prior Publication Data

US 2006/0250196 A1 Nov. 9, 2006

Related U.S. Application Data

(60) Division of application No. 10/162,531, filed on Jun. 3, 2002, now Pat. No. 7,117,025, which is a continuation of application No. 09/633,592, filed on Aug. 7, 2000, now abandoned.

(51) Int. Cl.
*H03H 7/12* (2006.01)
*H01B 12/02* (2006.01)

(52) U.S. Cl. .................... 333/17.1; 333/99 S; 505/210

(58) Field of Classification Search .............. 333/99 S, 333/17.1, 174, 205, 209, 231, 235; 505/210, 505/700, 701, 866
See application file for complete search history.

(56) References Cited

U.S. PATENT DOCUMENTS 3,067,394 A   12/1962   Zimmerman et al.
3,656,162 A   4/1972    Mee
4,500,854 A   2/1985    Meyer
4,726,071 A * 2/1988    Jachowski ................. 455/125
4,881,050 A   11/1989   Swanson, Jr.
5,132,282 A   7/1992    Newman et al.
5,227,748 A   7/1993    Sroka
5,231,078 A   7/1993    Riebman et al.
5,361,050 A   11/1994   Einbinder (Continued)

FOREIGN PATENT DOCUMENTS

DE          23 17 375       10/1974

(Continued)

OTHER PUBLICATIONS

Aitchison, C.S. et al., "Lumped-circuit elements at microwave frequencies" See Fig. 3B, *IEEE Transactions on Microwave Theory and Techniques*, 19(12):928-937, (Dec. 1971).

(Continued)

*Primary Examiner*—Benny Lee
(74) *Attorney, Agent, or Firm*—Merchant & Gould P.C.

(57) ABSTRACT

A method and apparatus for providing dynamic and remote tuning of a cryo-cooled bandpass filter is disclosed. The device includes resonator element and a voltage sensitive element as part of the capacitance in a narrow band filter circuit. A varactor such as a GaAs varactor may be used. Alternatively, a capacitor having a voltage-sensitive dielectric such as $SrTiO_3$ may be used. A computer may be connected to the varactor to provide for automated tuning. The voltage-sensitive capacitor may be integral with the resonator element. The invention provides for remote and dynamic tuning of a narrow bandpass filter while located within its sealed cryo-cooled environment.

13 Claims, 13 Drawing Sheets

U.S. PATENT DOCUMENTS

| | | | |
|---|---|---|---|
| 5,532,651 | A | 7/1996 | Jager et al. |
| 5,543,764 | A | 8/1996 | Turunen et al. |
| 5,616,539 | A | 4/1997 | Hey-Shipton et al. |
| 5,618,777 | A | 4/1997 | Hey-Shipton et al. |
| 5,990,766 | A | 11/1999 | Zhang et al. |
| 6,026,311 | A | 2/2000 | Cortes et al. |
| 6,097,263 | A | 8/2000 | Mueller et al. |
| 6,130,189 | A | 10/2000 | Matthaei |
| 6,144,263 | A | 11/2000 | Katsumata et al. |
| 6,178,339 | B1 | 1/2001 | Sakai et al. |
| 7,023,293 | B2 * | 4/2006 | Mattsson et al. .......... 333/17.1 |
| 7,117,025 | B2 * | 10/2006 | Shih et al. .................. 505/210 |
| 2001/0030585 | A1 * | 10/2001 | Jansson et al. ............ 333/17.1 |

FOREIGN PATENT DOCUMENTS

| | | |
|---|---|---|
| DE | 4 009 076 | 9/1991 |
| EP | 0 350 256 A2 | 1/1990 |
| EP | 0 481 607 A1 | 4/1992 |
| FR | 2 577 067 | 8/1986 |
| JP | 57 97 715 | 6/1982 |
| WO | WO 96/12320 | 4/1996 |
| WO | WO 00/35042 | 6/2000 |

OTHER PUBLICATIONS

Chaloupka, H., "High-Temperature Superconductors—A Material for Miniaturized or High-Performance Microwave Components", *Frequenz*, vol. 44, No. 5, pp. 141-144 (May 1990).

Fathy, A., et al., "Superconducting Narrow Band Pass Filters For Advanced Multiplexers", *IEE MTT-S Digest*, pp. 1277-1280 (1993).

Fathy, A., et al., "Critical Design Issues in Implementing a YBCO Superconductor X-Band Narrow Bandpass Filter Operating at 77K", *IEEE MTT-S Digest* pp. 1329-1332 (1991).

Hammond, R.B. et al., "Designing with superconductors", See p. 36, left column, line 29- line 35, *IEEE Spectrum* 30(4):34-39 (Apr. 1993) New York US.

Morgan, D., et al., "Lumped Element Filters for Electronic Warfare Systems", *Microwave Journal*, pp. 127-136 (Feb. 1986).

Nagai, Y. et al., "Properties of superconductive bandpass filters with thermal switches" See p. 830, left column, line 17-line 30, *Applied Physics Letters* 63(6):830-832 (Aug. 9, 1993) New York, US.

Newman, N., et al., "High-Temperature Superconducting Microwave Devices: Fundamental Issues in Materials, Physics, and Engineering", *Journal of Superconductivity* 6(3):119-160 (1993).

Patzelt, T. et al., "High-temperature superconductive lumped-element microwave allpass sections" See p. 1579, left column, line 37-line 42; Fig. 1, *Electronics Letters* 29(17):1578-1580, (Aug. 19, 1993) Stevenage GB.

Swanson, D., "Thin-Film Lumped-Element Microwave Filters", *IEEE MTT-S Digest*, pp. 671-674 (1989).

Swanson, Jr., D., et al., "A 10 GHz Thin Film Lumped Element High Temperature Superconductor Filter", *IEEE MTT-S Digest*, pp. 1191-1193 (1992).

Zhang, D. et al, "Narrowband lumped-element microstrip filters using capacitively-loaded inductors", *IEEE MTT-S International Microwave Symposium—Digest* 2(16-20):379-382 (May 1995).

Zhang, D. et al., "Microstrip Filters For Wireless Communications Using High-Temperature Superconducting Thin Films", *Applied Superconductivity* 5(3):483-496, 1995 Copyright © 1996 Elsevier Science Ltd.

U.S. Appl. No. 08/706,974, filed Sep. 3, 1996, which is a FWC of U.S. Appl. No. 08/323,365, filed Oct. 14, 1994, now abandoned.

Forse, R., et al., "GHz Downconverter Using HTS Films", Proceedings of the SPIE—The International Society for Optical Engineering, vol. 2156 p. 80-87 (1994).

* cited by examiner

VARACTOR TUNING FOR A NARROW BAND FILTER INCLUDING AN AUTOMATICALLY CONTROLLED TUNING SYSTEM

CROSS REFERENCE TO RELATED APPLICATIONS

This application is a divisional of application Ser. No. 10/162,531, filed Jun. 3, 2002 and issued as U.S. Pat. No. 7,117,025 on Oct. 3, 2006, which is a continuation of application Ser. No. 09/633,592, filed Aug. 7, 2000 (abandoned), which applications are incorporated herein by reference.

FIELD OF THE INVENTION

This invention relates generally to electrical filters, more particularly relates to a method and apparatus for adjusting the response of an electrical filter, and more particularly still relates to a method and apparatus for replacing a portion of the capacitance in a narrow band filter with a voltage adjustable device for varying the characteristic frequency of the filter.

BACKGROUND OF THE INVENTION

Electrical bandpass filters allow certain frequency components of an input signal to pass unattenuated from the input terminals to the output terminals, while all components having frequencies outside of the passband are attenuated. In environments where accuracy of the passband is required, the bandpass filter may need adjustment in order to meet the specifications of the individual applications and customers. Such adjustments may be required for a number of different parameters. Several of the more critical parameters include: frequency accuracy, return loss, insertion loss, and bandwidth. The need for the physical filter to meet the desired parameters becomes even more critical with narrow band filters of the type utilized in connection with wireless communications applications such as cellular and PCS.

Unfortunately, the need for adjustment of these narrow band filters can not be easily eliminated by design due to manufacturing limitations and physical characteristics. More specifically, the manufacturing and physical characteristics change from physical device to physical device due to dielectric constant variations of the substrate; thickness variations of the substrate; variations of the photolithographic pattern; and the aging effect due to temperature change and cycling of the filter.

One method which has been previously utilized to adjust RF filters is to utilize moveable conductors or dielectrics, such as tuning screws or spring pins. This approach is described in Socher, U.S. Pat. No. 5,968,875. In this type of system, a screw is used in connection with the capacitor type element. While this arrangement may be used to solve for dielectric constant variations of the substrate, the thickness variations of the substrate, and the photolithography variations of the photolithographic pattern, this type of tuning can not be utilized to solve for the aging effect due to temperature changes and cycling.

It will be appreciated that filters which are utilized at a constant or room temperature do not necessarily have a problem with an aging effect due to the temperature change in cycling. More specifically, filters used in these types of environments can be retuned at room temperature once the aging effect occurs. However, since cryo-cooled filters have been utilized, there has been a need in the art to develop a method and apparatus for tuning the filters dynamically without removing the filter from its cooled environment and while the filter is cooled.

SUMMARY OF THE INVENTION

The present invention provides for a dynamic and remote tuning of a cryo-cooled bandpass filter. The present invention also provides for either a varactor tuning device or non linear dielectric or ferroelectric such as $SrTiO_3$ (STO) device placed in a cryo-cooled vacuum vessel, wherein the filter may be tuned while located in its cooled environment. In one embodiment, an apparatus constructed according to the present invention does not require an operator to physically adjust the varactor device to tune the filter. Instead, computer controlled tuning may be utilized in order to implement dynamic tuning of a cryo-cooled filter.

In a preferred embodiment constructed according to the principles of the present invention, the device includes a voltage sensitive element, such as a voltage sensitive capacitor, as part of the capacitance in a narrow band filter circuit. By implementing the varactor in this fashion, the drawbacks associated with either substrate or photolithographic pattern variations are substantially diminished or eliminated. Additionally, such a device solves the recycle/retuning problems since tuning can be adjusted by an external computer after the filter is enclosed in the cryo-cooled vacuum vessel. In other words, a temperature recycle can be run first, and then the filter can be tuned to help optimize the filter to the individual specification/customer need for that specific filter. In this fashion, remote and dynamic tuning can be accomplished in a sealed cryo-cooled environment.

In an alternative embodiment, tuning high temperature superconductor ("HTS") filter is accomplished by use of ferroelectric capacitors whose dielectric constants can be altered by varying the electric field (e.g., a voltage) applied to the capacitor. Certain ferroelectrics such as $SrTiO_3$ ("STO") have this property. In fact, this material demonstrates a very large change in permittivity with applied field at cryogenic temperatures. An advantage is that this material is one of the few that is readily compatible with $YBa_2Cu_3O_{7-\delta}$ ("YBCO") (wherein the range of values for $\delta$ is $0 \leq \delta \leq 1$) both chemically and structurally, meaning that the two materials can be grown next to each other in a multilayer structure. The relative dielectric constant of STO is also very high which also preserves the small-size advantage of YBCO filters. STO also provides for being integrated directly with YBCO instead of externally coupled to the filters as in the case of a varactor based system.

According to one aspect of the invention, there is provided a tuning device for a bandpass filter. The tuning device includes a resonator that includes a resonator element and a voltage-sensitive capacitor, i.e., a capacitor that has a capacitance that varies with the applied voltage. The resonator frequency thereby changes and shifts the passband characteristics of the filter.

According to another aspect of the invention, the voltage sensitive capacitor is a varactor.

According to another aspect of the invention, the voltage sensitive capacitor includes a dielectric, such as $SrTiO_3$, having a voltage-sensitive dielectric constant.

According to another aspect of the invention, the voltage sensitive capacitor has a sufficient capacitance to substantially maintain the voltage across the capacitor when power is applied to the capacitor intermittently.

According to another aspect of the invention, the plate of the voltage-sensitive capacitor and the resonator element are made of the same superconductor, whereby the voltage-sensitive capacitor and the resonator element are integral with each other.

While the invention will be described with respect to a preferred embodiment circuit configuration and with respect to particular circuit components used therein, it will be understood that the invention is not to be construed as limited in any manner by either such circuit configurations or circuit components described herein. Also, while the particular types (i.e. such as GaAs) of circuit components will be described with respect to the description of a preferred embodiment to the invention, it will be understood that such particular circuit types are not to be construed in a limiting manner. Still further, while the preferred embodiment and invention will be described in relation to a cryo-cooled filter device, it will be understood that the scope of the invention is not to be limited in any way by the environment in which it is employed. The principles of this invention apply to the utilization of a voltage sensitive element as a portion of the capacitance in a filter device. These and other variations of the invention will become apparent to those skilled in the art upon a more detailed description of the invention.

Other advantages and features which characterize the invention are pointed out with particularity in the claims annexed hereto and forming a part hereof. However, for a better understanding of the invention, its advantages and objectives obtained by its use, reference should be had to the drawing which forms a further part hereof and to the accompanying descriptive matter, in which there is illustrated and described a preferred embodiment to the invention.

BRIEF DESCRIPTION OF THE DRAWINGS

Referring to the drawing, wherein like numerals represent like parts throughout the several views.

DETAILED DESCRIPTION OF THE DRAWINGS

As mentioned above, the principles of this invention apply to the dynamic tuning of a narrow band filter by using a voltage sensitive device as a portion of the capacitance in a bandpass filter. In a preferred embodiment a varactor provides a tunable capacitance by applying an adjustable voltage. A preferred environment in which the present invention may be employed is in the tuning of a narrow band filter in a cryo-cooled environment. Such application is but one of innumerable types of applications in which the principles of the present invention can be employed.

Figure 1:
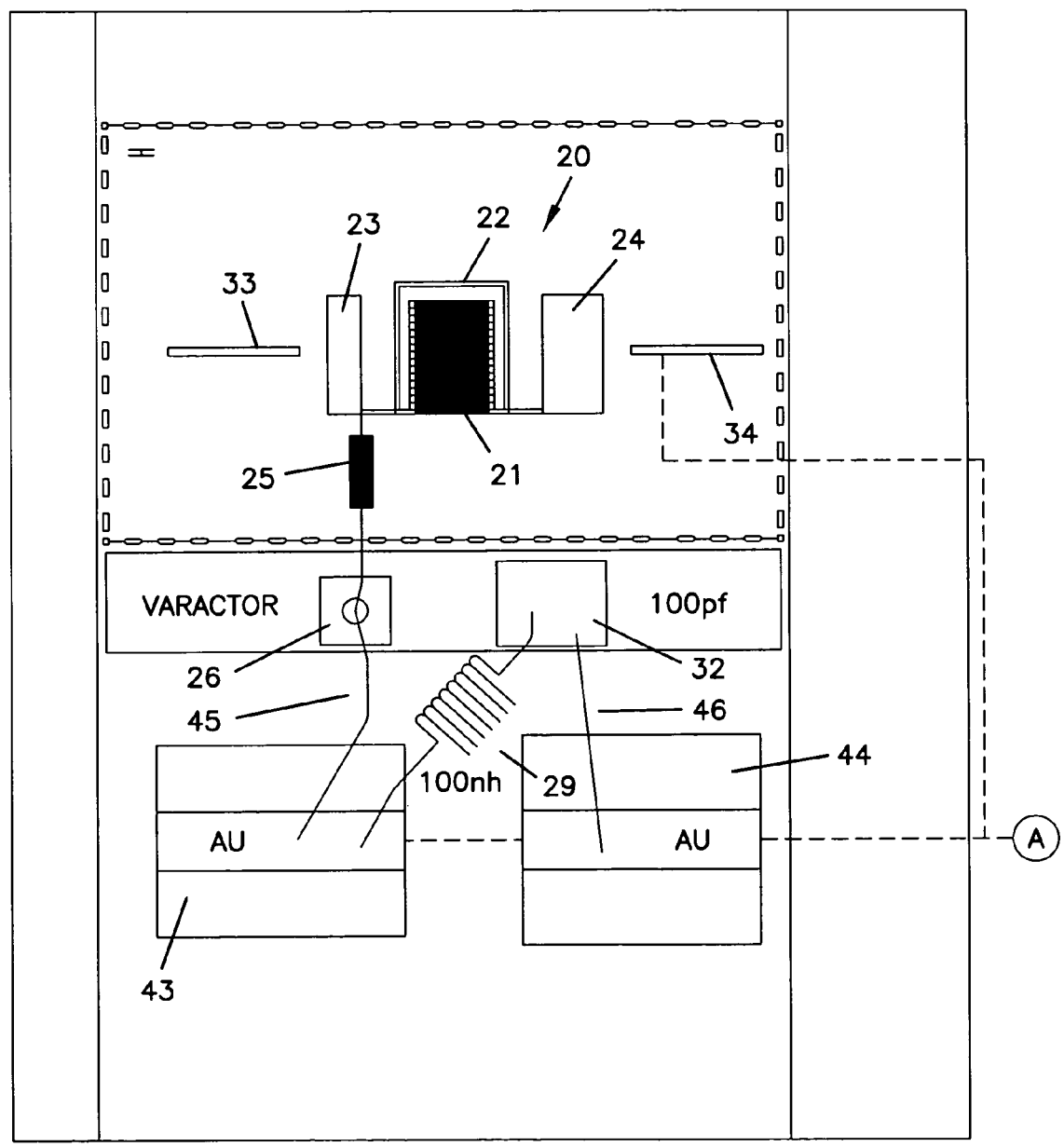
FIG. 1 illustrates a filter element including the voltage sensitive element of the present invention.
Figure 2:
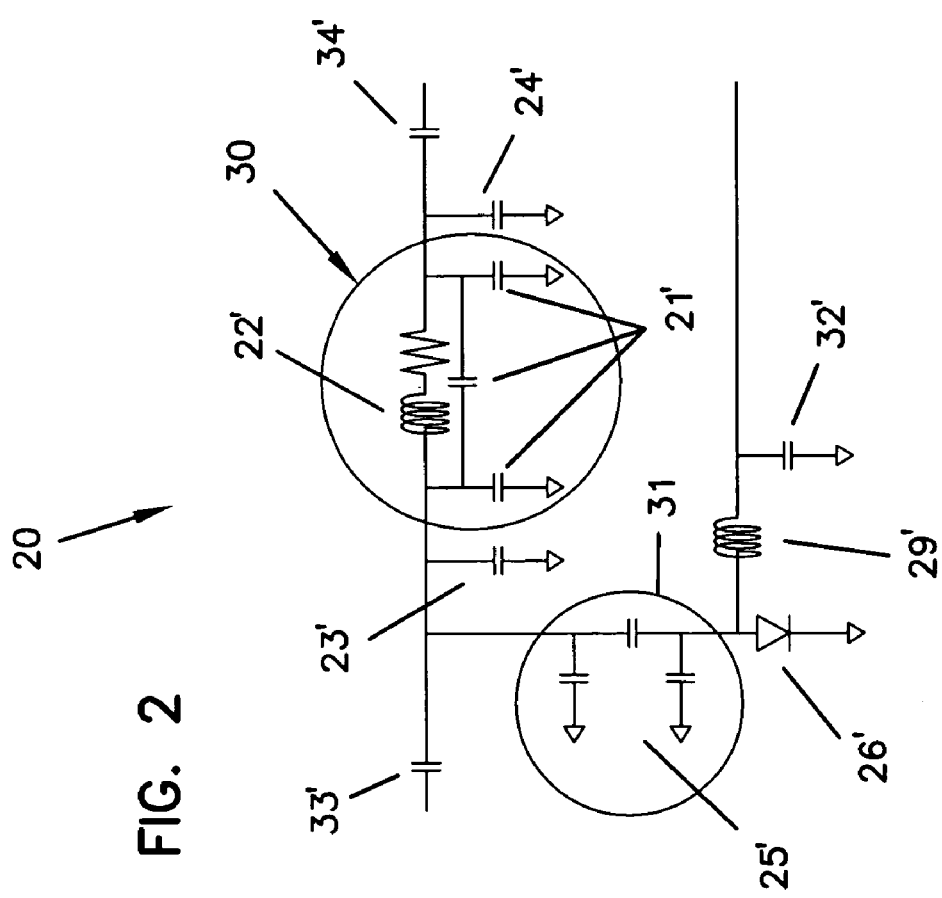
FIG. 2 is a schematic showing an equivalent circuit identified in FIG. 1.

Referring first to FIGS. 1 and 2, there is illustrated a representative narrow bandpass filter 20. Both FIGS. 1 and 2 illustrate the same filter 20. However, FIG. 1 illustrates the devices as they are realized in a preferred embodiment layout. In the preferred embodiments filter elements 21, 22, 23, 24, 33 and 34 and the ground plane are realized in an HTS material. However, other suitable materials may be used. The equivalent elements are shown in FIG. 2 (e.g., within circles 30 and 31).

The filter 20 includes a resonator element including an inductor element which is a half loop inductor 22 in FIG. 1 and inductor 22' in FIG. 2. The resonator element also includes a capacitor element, which is realized as a first interdigitial capacitor element 21 in FIG. 1. Capacitors 21' illustrate the capacitance of the equivalent circuit in FIG. 2. Capacitors 33 and 34 in FIG. 1 provide input and output to the circuit (33' and 34' in FIG. 2). The resonator element also includes capacitors 23 and 24, which are realized as resonance elements in FIG. 1. These capacitances are illustrated as 23' and 24' in FIG. 2. It should be recognized that capacitor 23 (and 23') is smaller in capacitance than capacitor 24 (and 24'). A second interdigitial capacitor element 25 (see FIG. 1) comprising a plurality of fingers is connected at a first end to the node between capacitor 23 and capacitor 21. The smaller size of capacitor 23 allows capacitor element 25 to form part of the total capacitance of capacitor 23. As noted above and as will be discussed further below, by varying the capacitance of device 25, the tuning of the filter 20 can be accomplished. Pi-capacitor network 25' illustrates the equivalent circuit of device 25 (see FIG. 2).

Bandpass filter 20 is shown laid out with second inter-digitized capacitor 25 also laid out. Varactor device 26 is shown connected to first block 43 via lead wire 45 as shown in FIG. 1. The first block 43 is a bonding pad preferably having a low Q. The varactor device is preferably of the GaAs type. The characteristics of such a device include a high quality factor and a wide tuning range. Voltage regulating inductor 29 and capacitor 32 are also illustrated in FIG. 1 with lead wire 46 extending to second block 44. The second block 44 is a bonding pad. The bonding pads preferably include Au. In addition, an inductance of the inductor 29 is typically about 100 nh. A typical capacitance of the capacitor 32 is about 100 pf. Although particular material, structure, and configurations are illustrated in the exemplary embodiment, other embodiments might use different material, structures and configurations.

Figure 3:
FIG. 3 is an equivalent circuit for the voltage sensitive device of FIGS. 1 and 2, illustrating the equivalent varactor and resistance.

FIGS. 2 and 3 illustrate the equivalent circuit and devices as in FIG. 1. Circles 30 and 31 are provided merely as an aid in understanding the relationship between the realized devices and the equivalent devices. Accordingly, those of skill in the art will appreciate that the layout pattern devices identified within circles 30 and 31 find the equivalent circuits illustrated in FIG. 2 and that such realized devices should not be construed in a limiting manner. Connected to the second side of device 25 is the voltage sensitive device 26. FIG. 3 illustrates the equivalent circuit of the device 26 as realized in the preferred embodiment. More specifically, the voltage-sensitive device 26 includes a varactor 27 and resistance 28. To control the voltage at the point of junction between elements 25 and 26, an inductor 29 and capacitor 32 are provided.

Figure 4:
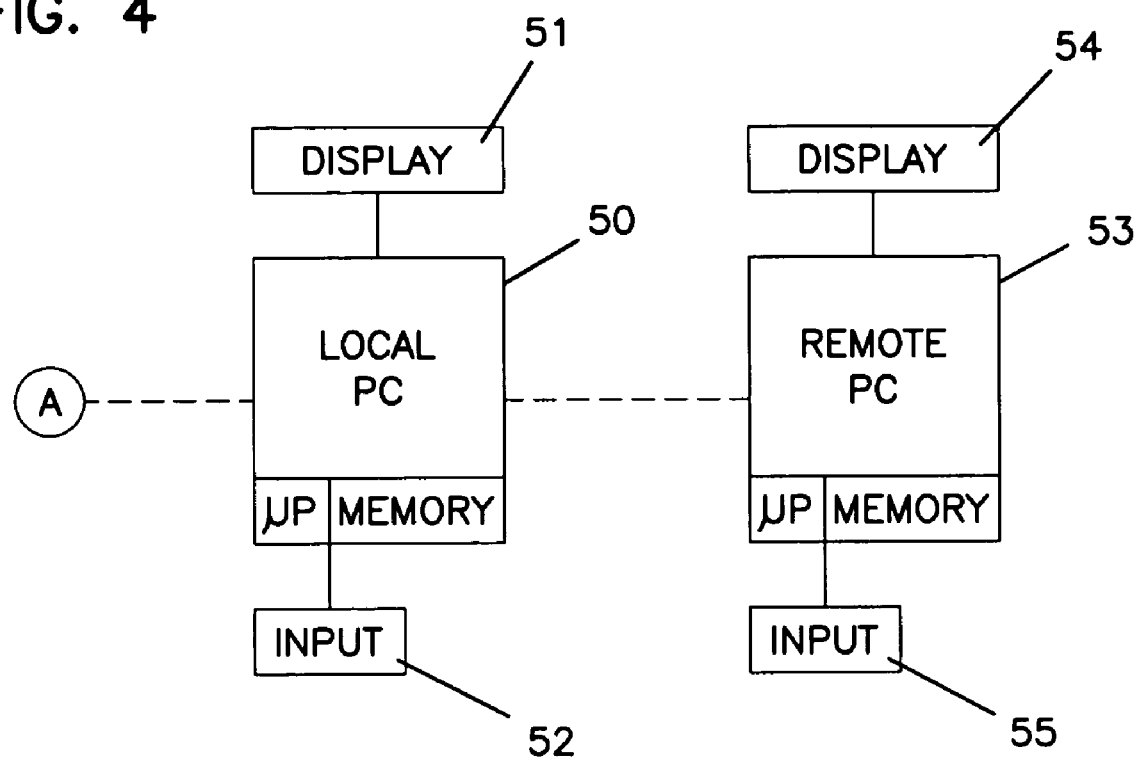
FIG. 4 is a schematic of a varactor device used in connection with a narrow band filter element.

It will be appreciated that an automated system as shown in FIG. 4 may employ a feedthrough connection from first and second blocks 43 and 44 to a local computer 50 (43 and 44 in FIG. 1). Local computer 50 includes a microprocessor and memory devices, as well as a display 51 (e.g., a CRT, LCD printer and/or other type of output device) and an input device 52 (e.g., a mouse, keypad, trackball, etc.). The local computer 50 may be a personal computer 50 (e.g., of the Macintosh and/or IBM compatible type) running a variety of operating systems. Alternatively, local computer 50 can be a dedicated or specialized device. In the preferred embodiment, local computer 50 is an IBM compatible computer running a Windows NT operating system.

Continuing on with FIG. 4, the varactor device 26 (in FIG. 1) may also be controlled from a remote location via remote computer 53. The remote computer 53 also includes an appropriate microprocessor, memory, input device 55 and display 54.

Figure 5A:
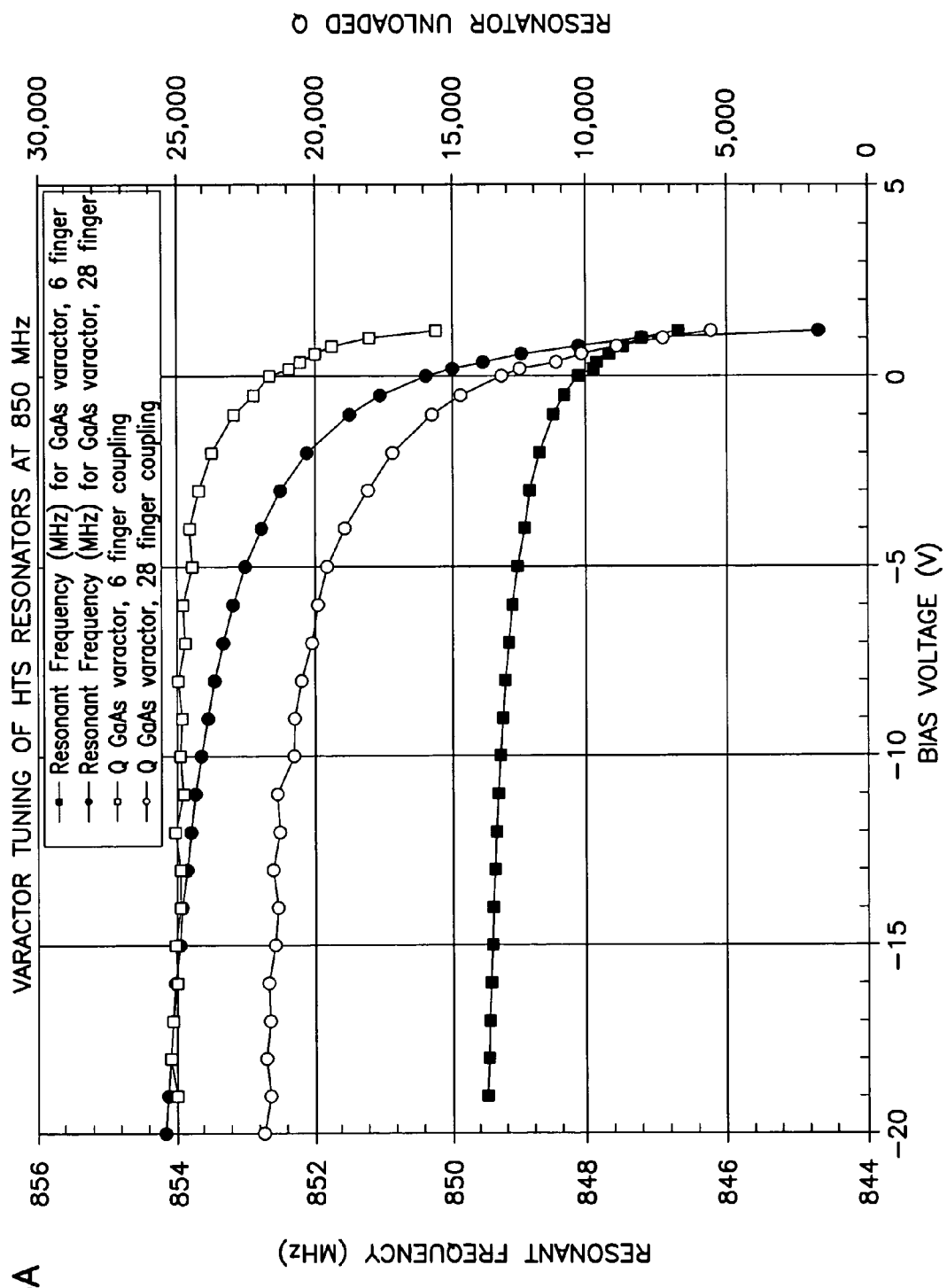
FIGS. 5a-5c illustrate resonant frequency versus bias voltage at 850 MHz, the resonator unloaded Q versus frequency tuned and the achievable unloaded Q versus the tuning range required in MHz, respectively.

FIG. 5a illustrates the results of varactor tuning of the resonator at 850 MHz. The varactor in the preferred embodiment is a MACOM GaAs varactor, which is available commercially. The resonant frequency (in MHz) is plotted against the bias voltage (in volts V). The four illustrated data sets are found in the following Table 1.

TABLE 1

Dark Square = Resonant Frequency (MHz) for GaAs varactor, 6 finger coupling
Dark Circle = Resonant Frequency (MHz) for GaAs varactor, 28 finger coupling
Open Square = Q GaAs varactor, 6 finger coupling
Open Circle = Q GaAs varactor, 28 finger coupling From this chart it can be seen that by choosing an interdigitated capacitor element with the appropriate amount of coupling, one can adjust the tuning range and resonant Q of the circuit. The tuning voltage range determines the bias voltage range needed to tune the circuit.

Figure 5B:
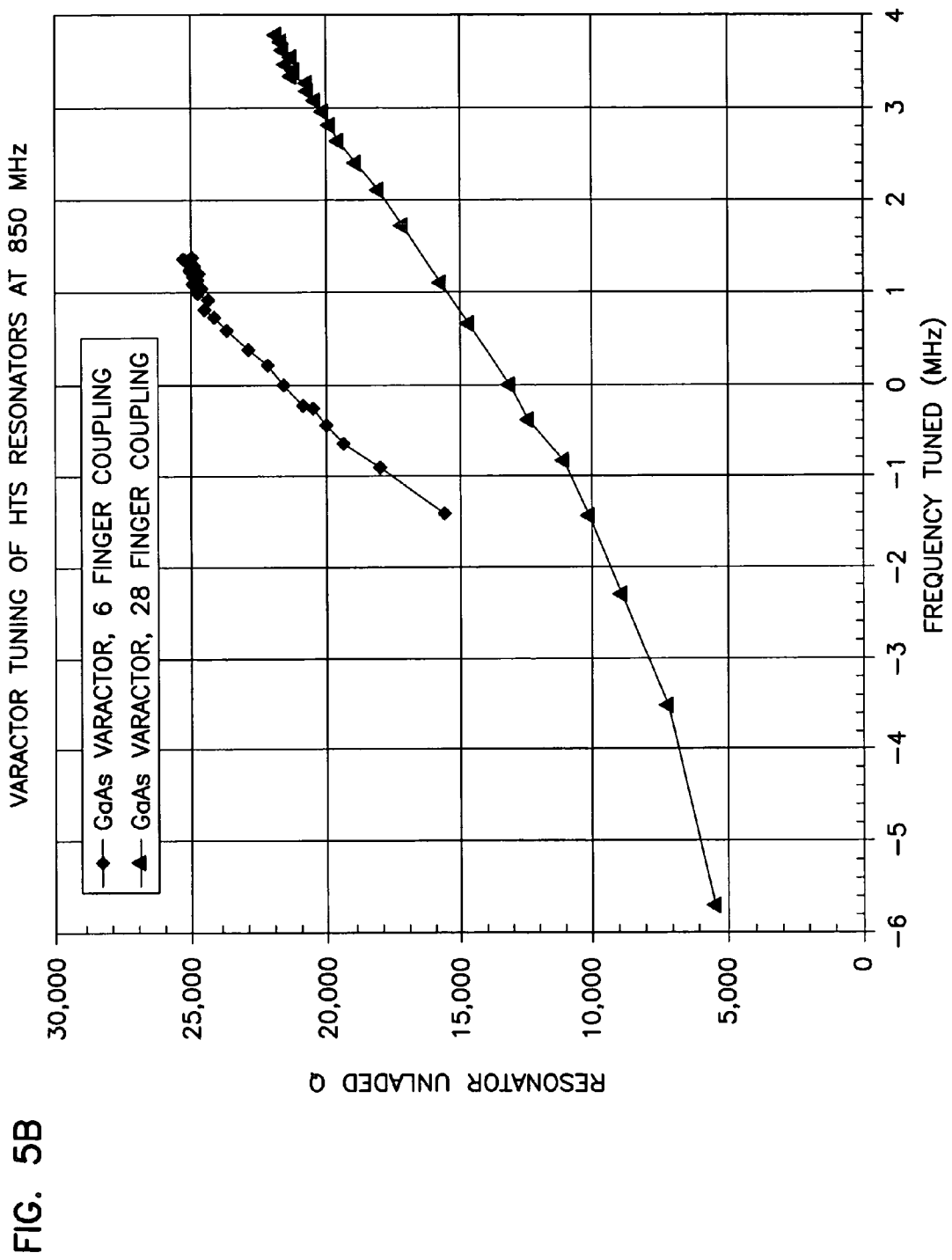

FIG. 5b illustrates the varactor tuning of the resonator at 850 MHz for the resonator unloaded Q versus the frequency tuned (MHz). Here, the GaAs varactor with 6 finger coupling is illustrated by the solid squares while the GaAs varactor with 28 finger coupling is illustrated with solid triangles. This chart illustrates that from the tuning frequency range needed, one can identify the resonator Q needed and the required coupling of the interdigitatal capacitor.

Figure 5C:
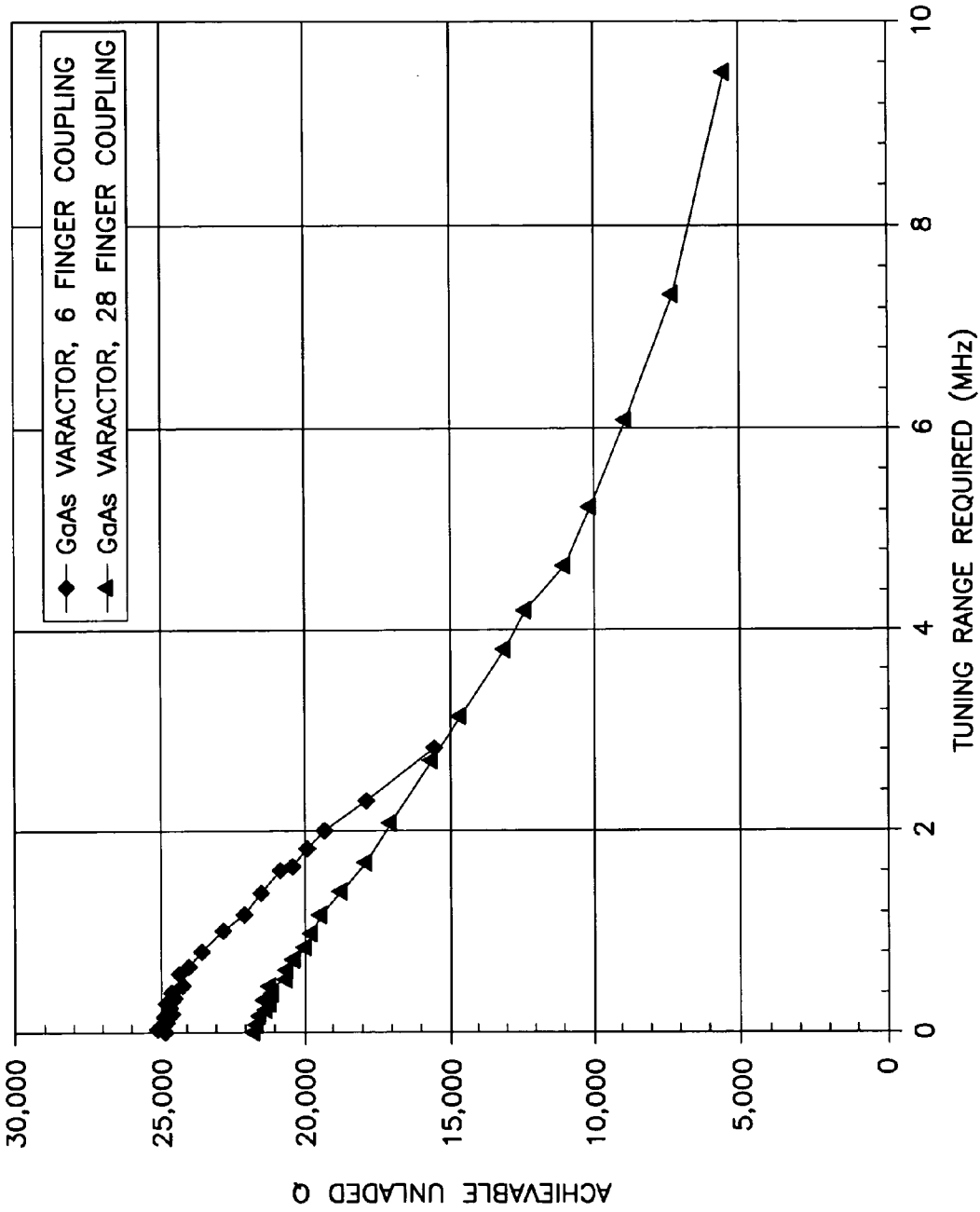

Finally, in FIG. 5c, the achievable unloaded Q is plotted versus a tuning range required (MHz). Plots are again identified with the same symbols and show that from the tuning range required, one can identify the resonator Q needed and the required coupling.

Now that the device has been described, a brief discussion of the option of the varactor tuning will be presented. First, it will be appreciated that the varactor diode is a specialized diode operated in the reverse voltage configuration. The varactor's capacitance C versus applied voltage V can be described as:

$$C=C_0/[1+V/0.8]^{1/2}$$

where $C_0$ is the capacitance at zero applied voltage.

Referring again to FIG. 1, the resonant frequency is determined by the inductor 22 and capacitors (23, 24, 21, 25). Here, the resonant frequency is proportional to the inverse of the square root of the multiplication of inductance and capacitance; the varactor (26) acts as a capacitor for compensating capacitor (25). Therefore, when the resonant frequency is too low, then the capacitance is reduced to increase the resonant frequency. Alternatively, a reduction in capacitance occurs by applying an external direct current voltage to the varactor. In this manner, a higher applied voltage results in a lower value of the capacitance—and vice versa.

RF input power can leak through the varactor to the dc feedline. However, the inductor coil (29) and capacitor (32) act as an isolation from RF to DC, thereby helping prevent this power leak.

Capacitance (32) also has another function. More specifically, it can hold the electric charge for a fairly long time (30 minutes) under very cold temperature conditions (e.g., 60 Kelvin). Therefore, it can maintain the supplied voltage once the applied voltage is removed from the varactor(s). This characteristic allows an analog switch to sweep through multiple (e.g., sixteen) channels without permanently attaching a constant voltage to each line. This unique feature allows a single analog wire to the cooler (e.g., shown in FIG. 7) to supply a voltage to multiple separate lines, and this makes the cooler interface much simpler.

Figure 6:
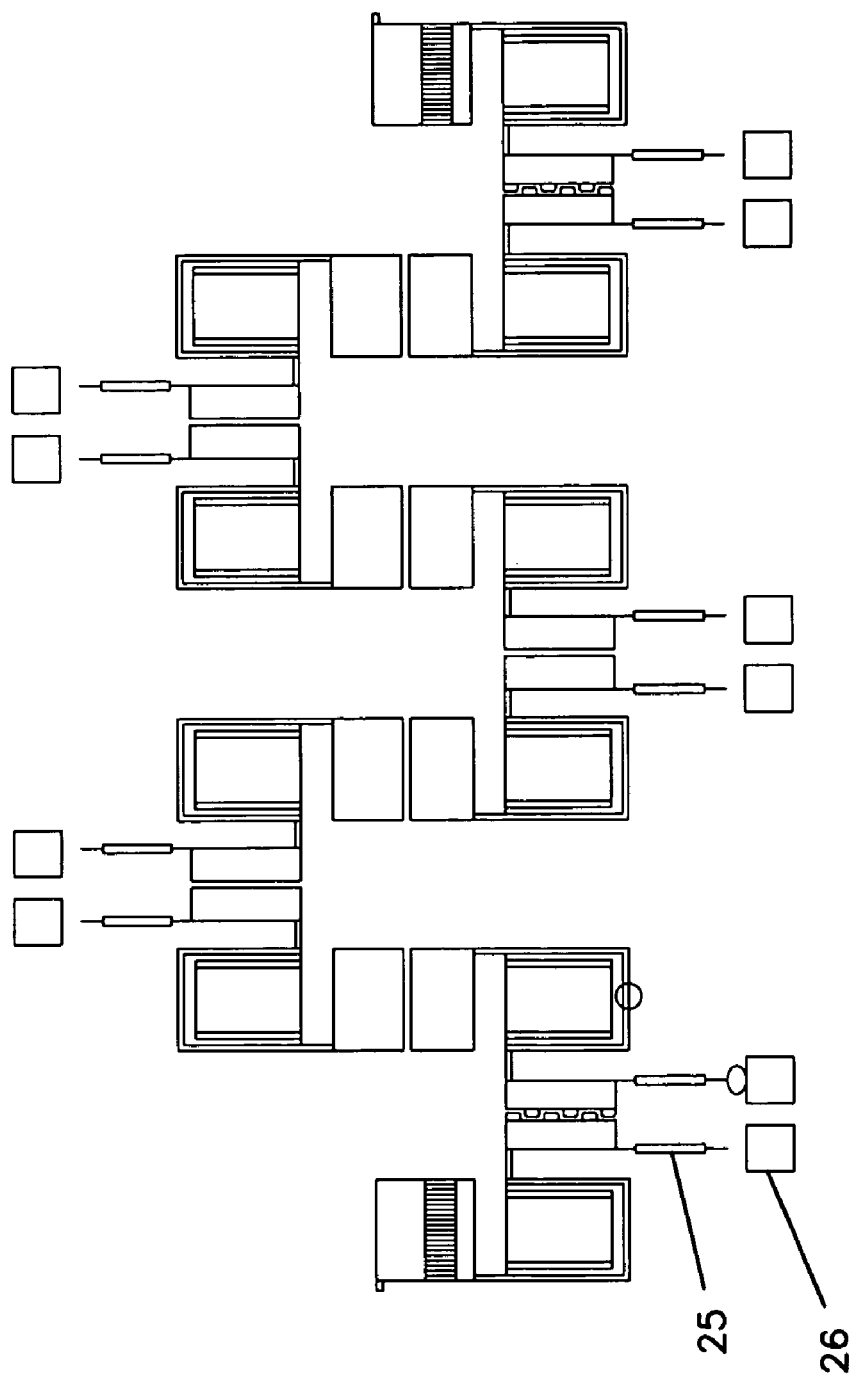
FIG. 6 illustrates a number of varactor tuning devices used in connection with a preferred embodiment narrow band filter.

FIG. 6 illustrates a ten pole bandpass filter, where each resonator is provided with a capacitor device 25. Varactor devices 26 are then attached as illustrated. Accordingly, the entire filter could then be tuned. In FIG. 6, the functional blocks used in connection with dynamically tuning the filter are illustrated.

Figure 7:
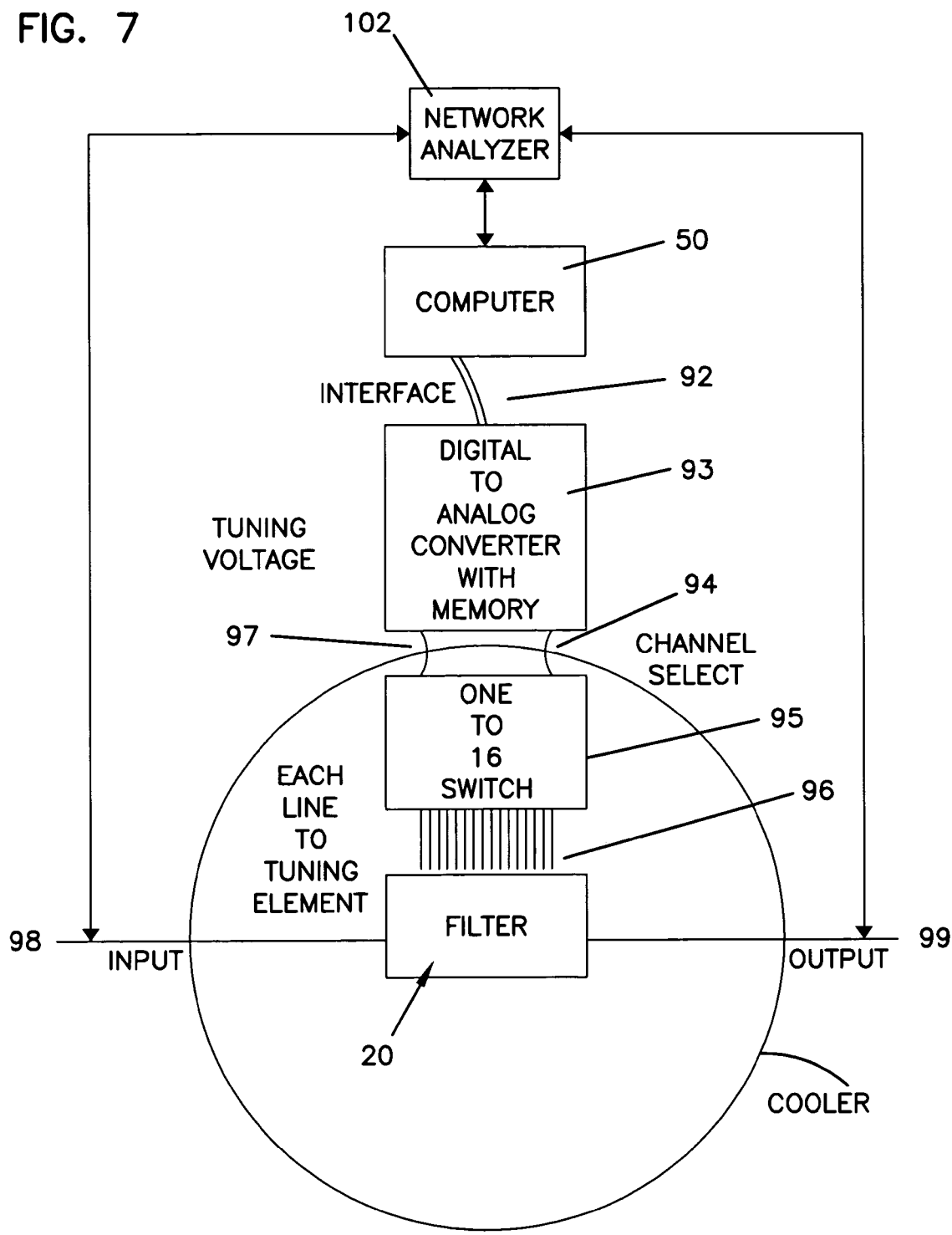
FIG. 7 is a logical flow diagram of a the steps utilized by a computer to implement automatic tuning in accordance with the principles of this invention.

Turning now to FIG. 7, the filter characteristics can be monitored by connecting a network analyzer 102 to input 98 and output 99. The method then used to tune the filter 20 is by entering the voltage number of each varactor device 25 in FIG. 1 to the computer 50. After the command, the signals pass through the interface cable 92 to the digital to analog converter 93. The digital to analog converter includes memory for both the voltage levels and the corresponding channels (e.g., a channel is provided for each varactor tuning element in the filter. The channels are illustrated at 96.

In turn, these numbers are provided to the one-to-sixteen switch at block 95. Tuning voltage is provided via line 97, while the channel select is provided by line 94. The switch 95 selects one of the lines 96 by the channel select command provided by line 94. The analog voltage then goes to the specific line 96 for a given channel select command. In turn, the analog voltage is provided to the specific line varactor device for a period of time set by the computer. It then goes to another channel 96 and continues in a like fashion.

The filter response is monitored at the output line 99 by the network analyzer 102. If the response does not meet the specification, then a new set of voltages and channels can be entered manually into the computer 50, or the computer 50 can be programmed to select a new set of numbers. In this feedback loop type of arrangement, the capacitance can be changed by means of the varactors until the filter meets the desired parameters or the specified values.

By implementing the device as described herein, the filter can be dynamically customized with remote tuning. It will be appreciated that the foregoing invention is not limited to semiconductors, but might also include dielectric constant devices in other types of electrically variable capacitors, such as nonlinear ferroelectric capacitors.

The filter devices of the invention are preferably constructed of materials capable of yielding a high circuit Q filter, preferably a circuit Q of at least 10,000 and more preferably a circuit Q of at least 40,000. Superconducting materials are suitable for high Q circuits. Superconductors include certain metals and metal alloys, such as niobium as well as certain perovskite oxides, such as YBCO. Methods of deposition of superconductors on substrates and of fabricating devices are well known in the art, and are similar to the methods used in the semiconductor industry.

In the case of high temperature oxide superconductors of the perovskite-type, deposition may be by any known method, including sputtering, laser ablation, chemical deposition or co-evaporation. The substrate is preferably a single crystal material that is lattice-matched to the superconductor. Intermediate buffer layers between the oxide superconductor and the substrate may be used to improve the quality of the film. Such buffer layers are known in the art, and are described, for example, in U.S. Pat. No. 5,132,282 issued to Newman et al., which is hereby incorporated herein by reference. Suitable dielectric substrates for oxide superconductors include sapphire (single crystal $Al_2O_3$) and lanthanum aluminate ($LaAlO_3$).

A five pole filter is described in more detail in the co-pending application assigned to the assignee hereof entitled: FREQUENCY TRANSFORMATION APPARATUS AND METHOD IN NARROW-BAND FILTER DESIGNS, Ser. No. 08/706,974, filed on Sep. 13, 1999 and issued as U.S. Pat. No. 6,438,394. Such application is incorporated herein by reference and made a pan hereof.

ALTERNATIVE EMBODIMENT

A related, but alternative, solution for trimming an HTS filter is to use ferroelectric capacitors whose dielectric constant can be altered by applying an electric field (e.g., a voltage) in place of a GaAs varactor. Certain ferroelectrics such as $SrTiO_3$ ("STO") have this property. In fact, this material demonstrates a very large change in permittivity with field at cryogenic temperatures. Another advantage is that this material is one of the few that is readily compatible with YBCO both chemically and structurally, meaning that the two materials can be grown next to each other in a multilayer structure. The relative dielectric constant of STO is also very high which preserves the small-size advantage of YBCO filters. STO also provides for being integrated directly with YBCO instead of externally coupled to the filters as in the case of the varactor based system described above. It is believed that this material will perform well up to the highest frequencies described above. Also, these types of dielectrics largely do not suffer from the noise problems of semiconductor electronics. Tunable dielectric materials thus have the following advantages over semiconductor varactors:

1) Chemical, structural, and thermal compatibility with YBCO allowing on-chip integration
2) Lower power needed for operation (almost zero)
3) Larger change in permittivity for a given applied voltage
4) Less noise
5) Can be manufactured in thin-film form
6) Free from electrostatic discharge damage
7) Planar structure is easy to trim Also, a semiconductor varactor has a diode like I-V characteristic (unsymmetric), i.e., it has a very low leakage current at a negative voltage bias, but it has a parabolic dependence of the forward current on positive bias. This can cause a dc-offset on the device when it is biased at zero voltage or a small negative voltage. This dc offset depends on the input RF power and can cause a change in the device capacitance. However, in the case of the alternative embodiment (e.g., an STO based capacitor), the I-V characteristic is symmetric or nearly symmetric, and the capacitor value is much less sensitive to the input power. In one preliminary test, a notch filter showed a noise figure improvement of 20 dB with use of thin-film STO capacitors instead of MACOM GaAs varactors.

To prepare an STO thin-film tuning capacitor, STO thin films may be grown in conventional ways (e.g. by laser ablation or co-evaporation). The laser-ablated films are deposited in an oxygen ambient (100 to 200 mTorr) using either ceramic or single-crystal targets. A variety of substrates can be employed (with their respective lattice mismatches with single-crystal STO): $LaAlO_3$ (2.9%), MgO (7.9%), $NdGaO_3$ (1.9%), and $Al_2O_3$ (2.1%). During growth, substrate temperatures are between 740 and 850° C. The typical film thickness is about 2 µm.

An Au layer on top of the STO thin film can be deposited thermal evaporation or ion-beam sputtering. This layer used as the metal to form the co-planar interdigitated capacitors. The typical thickness of these electrodes is about 300 nm. A thin layer of Mo (about 15 nm) can be used to increase the adhesion of the Au layer to the STO thin film.

Figure 8A:
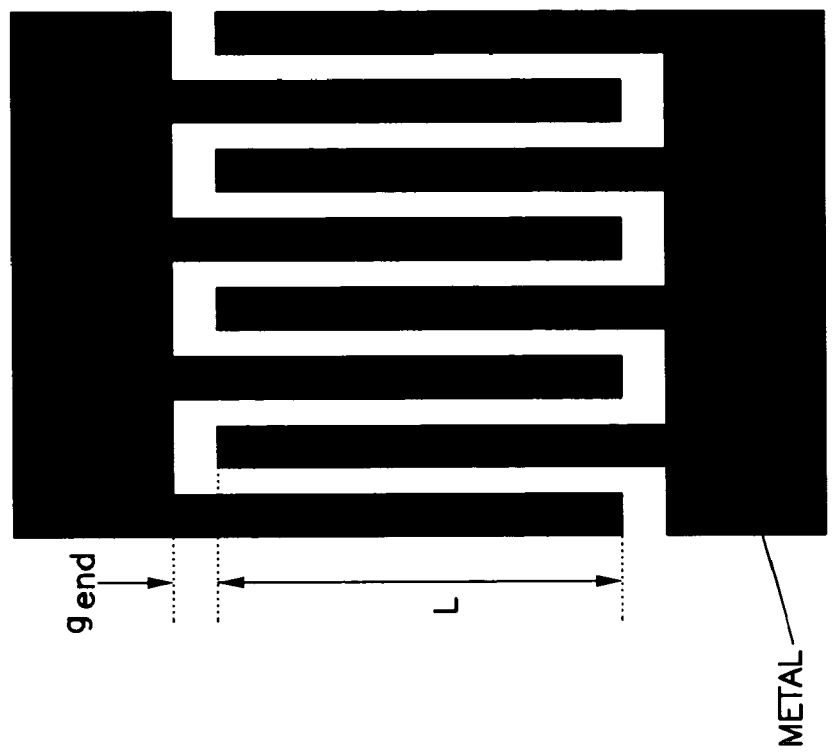
FIGS. 8a and 8b illustrate a cross section and a layout of a coplanar interdigitated capacitor structure.
Figure 8B:
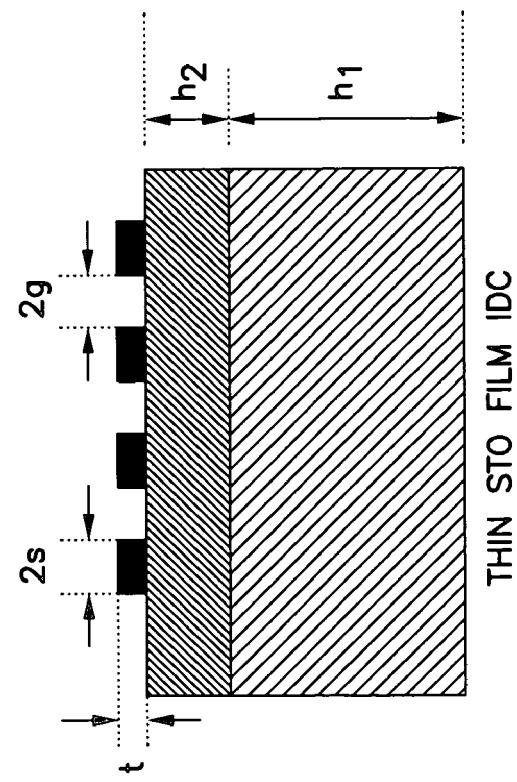

Coplanar interdigitated capacitor structures (e.g., FIGS. 8a and 8b) or slot capacitor structures are patterned on the Au layer while the STO film still covers the whole substrate. FIG. 8a shows a STO capacitor with a patterned Au layer of thickness t, where such each capacitor structure is separated by a gap 2g, and each structure is a width 2s. Also shown is a STO film layer, of height $h_2$, is bonded to a substrate, of height $h_1$ and possessing a dielectric constant of $\in_1$. More particularly, FIG. 8a illustrates a STO thin film IDC cross section, with FIG. 8b illustrating the layout of an interdigitated capacitor (of length L (FIG. 8b), space 2g (FIG. 8a), width 2s (FIG. 8a)) patterned on a ferroelectric thin film (height $h_2$, dielectric constant $\in_1$). For dc-characterization (capacitance and loss values), these capacitors typically consist of 20 interdigitated fingers spaced 10 µm apart with a length of 1 mm. A gap $g_{end}$ (FIG. 8b) is provided that separates the end of a interdigited capacitor and the unpatterned edge of the ferroelectric thin film, or metal (identified with the label "metal"). Four bias leads are used for the dc-characterization. The dielectric constant $\in_1$ may be derived from the capacitance measured by an LCR-meter based on an analytic solution disclosed by Gevorgian et al. in IEEE Trans. on Microwave Theory & Techniques, vol. 44, 1996, p. 896-904, which is hereby incorporated herein by reference. To briefly outline the analytic solution, for an interdigitated capacitor of n fingers, the capacitance, C, can be expressed as:

$$C = C_3 + C_n + C_{end},$$

wherein

-continued $$C_n = (n-3)\varepsilon_0\varepsilon_{en}\frac{K(k_0)}{K(k'_0)}l;$$

$$C_3 = 4\varepsilon_0\varepsilon_{e3}\frac{K(k_{03})}{K(k'_{03})}l;$$

and $$C_{end} = 2n(2+\pi/2)\varepsilon_0\varepsilon_{end}\frac{K(k_{0end})}{K(k'_{0end})}l.$$

Here, $\varepsilon_{en}$, $\varepsilon_{e3}$ and $\varepsilon_{end}$ are effective dielectric constants, which are functions of the dielectric constants of the thin film and substrate and of the geometry of the capacitor. K's are functions of the geometry of the capacitor. $\varepsilon_{end}$ The parameters $k_0$, $K_{03}$ and $k_{0end}$ are the modulus of the elliptic integrals, and the parameters $k_0'$, $k_{03}'$ and $K_{0end}'$ are complementary modulus to $k_0$, $k_{03}$ and $K_{0end}$. Also, parameter l is the finger length.

For filter tuning applications and structures that result in capacitances around a few pF, a typical set of parameters for an interdigitated capacitor are 10 fingers of width 50 μm spaced 10 μm apart with a length of 50 μm. Typical parameters for a slot capacitor are a 10 μm gap with a width of 500 μm.

In a preferred embodiment a patterned substrate is diced in to small pieces (about 300 μm by 300 μm). Each dice contains a STO capacitor which can be integrated with an HTS resonator by either approach 1 or 2 to be described below. To reduce the parasitic capacitances from the Au bias leads (often of large size), the size of the bias pads is minimized. This can be accomplished by using laser trimming (under a high magnification optical microscope).

In the alternative embodiment, a circuit similar to the circuit described above in connection with the varactor described above can be used, except that an STO capacitor is used instead of a conventional varactor. Three different implementation approaches are described below. In these implementations, the performance is sufficient for tuning applications and is on a par with, and in some instances better than, commercially-available varactors.

Hybrid, flip-chip and monolithic designs are three different approaches for implementing a STO thin-film capacitor into a high-Q HTS resonator for tuning the resonant frequency. These designs are discussed further below and are shown schematically in FIGS. 9A, 9B, and 9C, respectively.

Figure 9C:
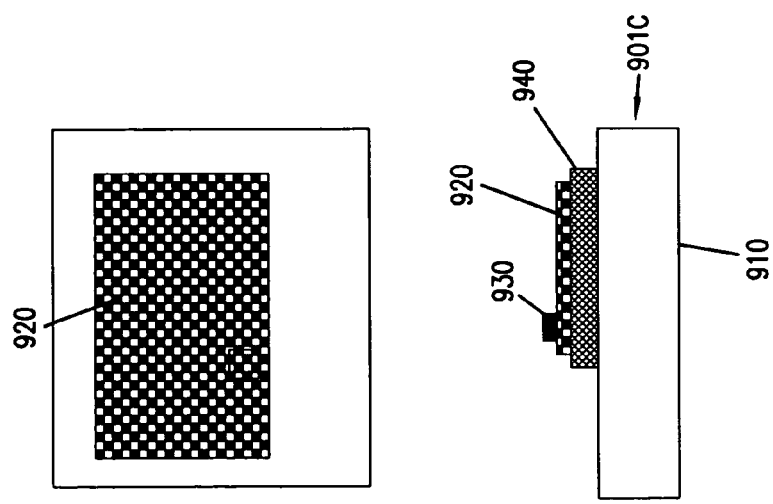
FIGS. 9a, 9b, and 9c illustrate three alternative approaches for implementing STO thin-film capacitor into a high-Q HTS resonator for trimming the resonance frequency in a hybrid, flip-chip and monolithic structure respectively.
Figure 9B:
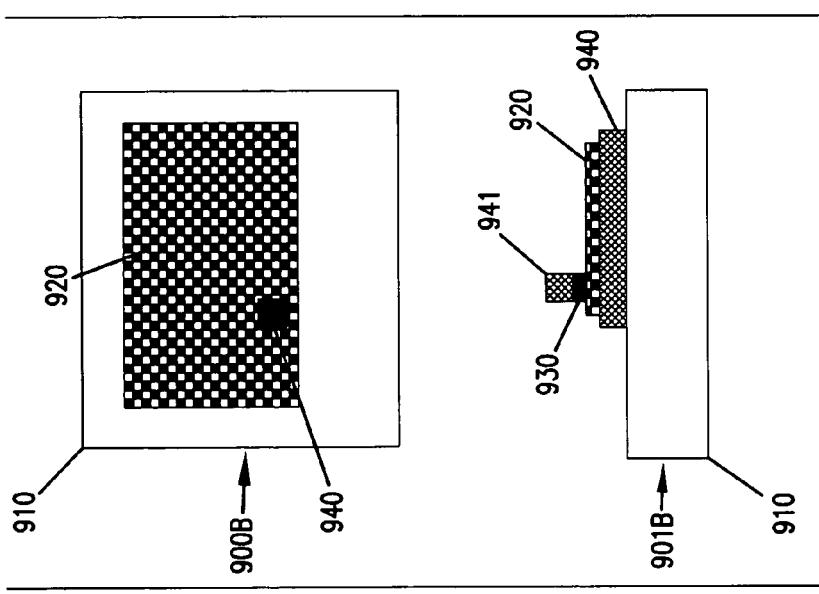
Figure 9A:
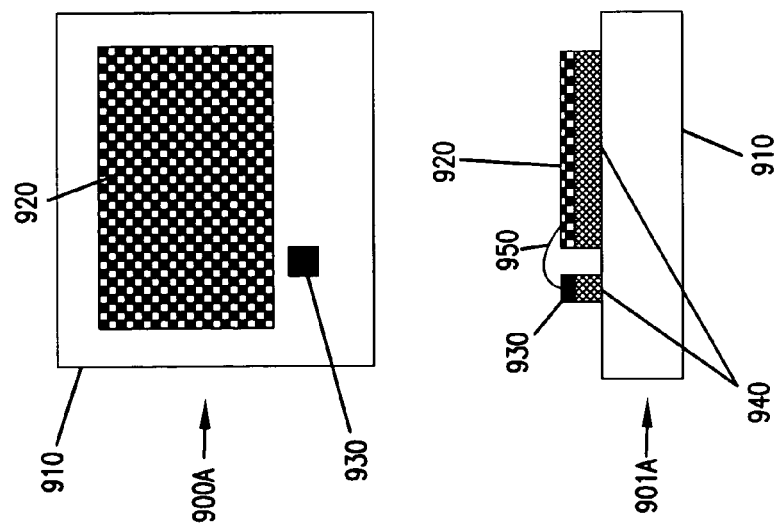

FIG. 9A shows both a top view 900A and a cross-sectional view 901 A of a hybird design implementation of a high-Q HTS resonator according to the present invention. The top view 900A of the device shows a resonator device 920, a YBCO resonator in this embodiment, placed above a metal package 910, and adjacent to STO capacitor 930. The cross-sectional view 901A illustrates a first substrate 940 coupled to a metal package 910, and further shows the STO interdigital capacitor element 930 disposed above the first substrate 940. A second, larger substrate is also coupled to the metal package 910, but is positioned adjacent to the first substrate 940. The YBCO resonator is disposed above the second substrate 940. Also, shown is a bonding wire 950 electronically coupled to both the STO interdigital capacitor element 930 and the YBCO resonator 920.

Figure 10:
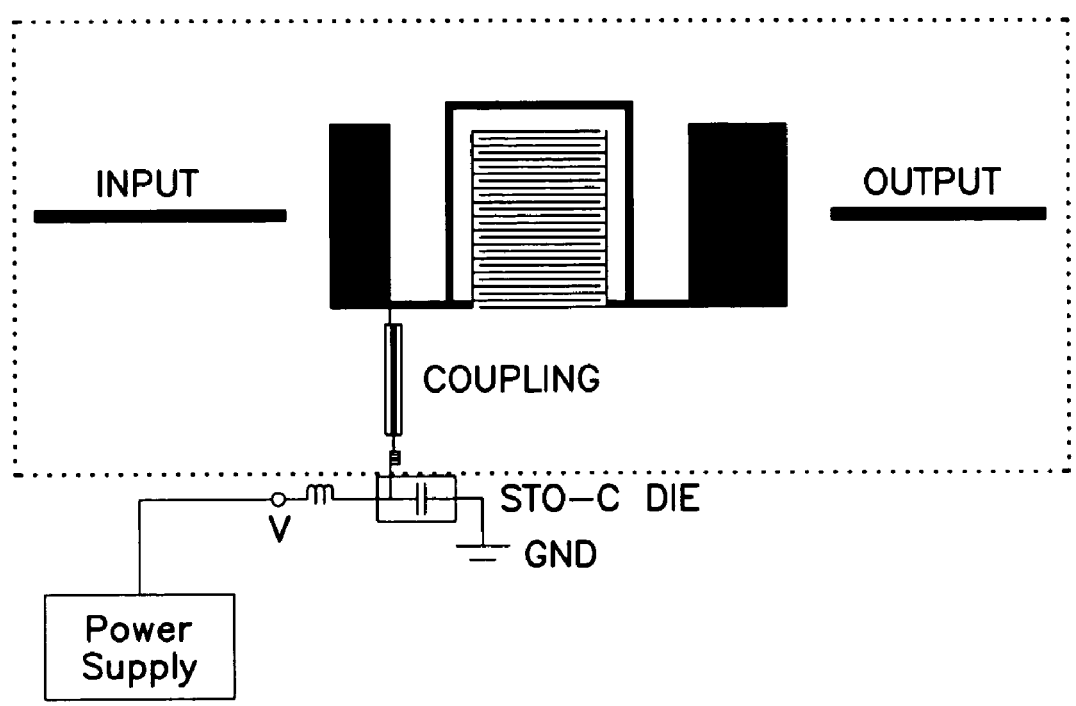
FIG. 10 illustrates a hybrid approach for implementing an STO tuning capacitor into a YBCO resonator.

FIG. 10 illustrates a hybrid approach for implementing an STO capacitor into a YBCO resonator. Specifically, FIG. 10 shows a Power Supply supplying a voltage V to a voltage regulator for a predetermined period of time. The voltage regulator is comprised of an inductor and capacitor STO-C DIE (an STO capacitor die) configuration, that is coupled to ground GND. The voltage regulator then supplies the varator with a voltage. The varactor is coupled to a resonator by a coupling element (e.g., a capacitor) COUPLING. As the capacitance of the varactor changes the passband characteristics of the resonator also changes. Also shown, is a first transmission line INPUT which delivers signals to the resonator and a second transmission line OUTPUT which delivers signals from the resonator to other circuitry.

The approach shown in FIG. 9A is similar to the implementation of the varactor. The approach shown in FIG. 9A can be implemented on the same YBCO resonator/filter as the varactor method and apparatus described above. The STO die is attached to the package by using conductive epoxy. This structure requires a first bonding wire between the decoupling capacitor and the tuning capacitor and a second bonding wire between the tuning capacitor and the package (e.g., as the grounding point).

FIG. 9B shows both a top view 900B and a cross-sectional view 901B of a flip-chip design implementation of a high-Q HTS resonator according to the present invention. The top view 900B of the device shows a resonator device 920, a YBCO resonator in this embodiment, placed above a metal package 910, and coupled to substrate 940. The cross-sectional view 901B illustrates a first substrate 940 coupled to a metal package 910. Above the first substrate 940 a resonator 920 is disposed. A STO capacitor 930 is disposed above and flip-chip bonded to the resonator 920. Indium is used as the bonding material. Finally, the figure shows a second substrate 941 coupled to and positioned above the STO capacitor 930.

Figure 11:
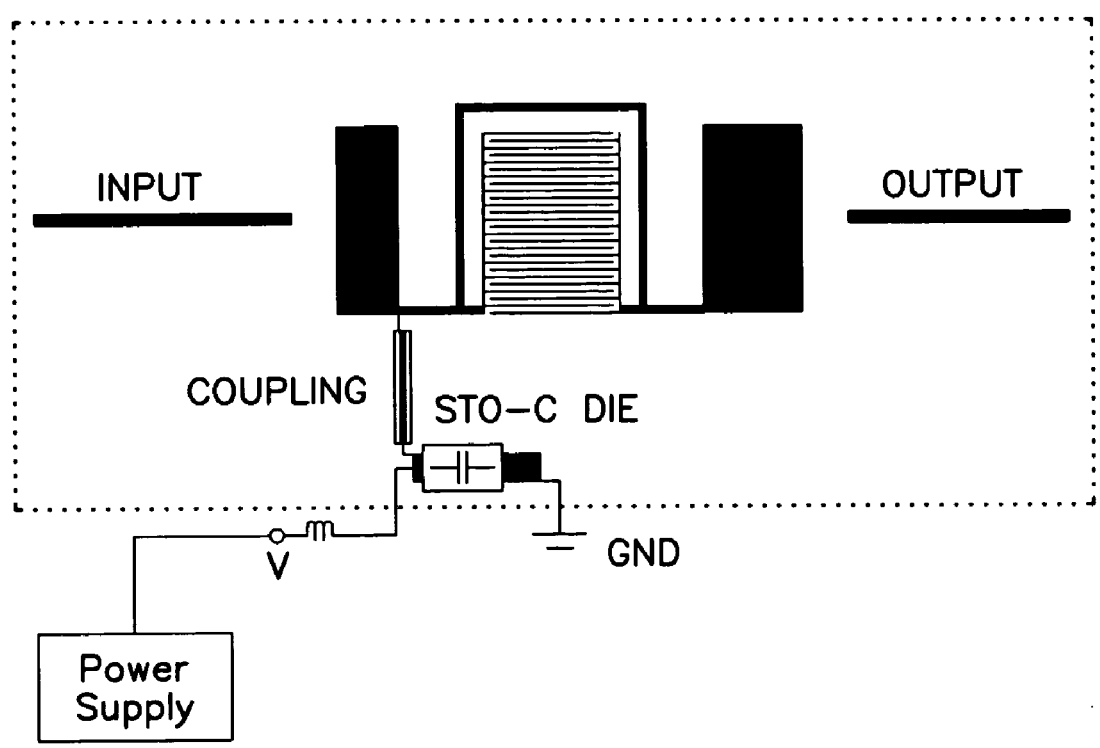
FIG. 11 illustrates a flip-chip approach for implementing an STO tuning capacitor into a YBCO resonator.

FIG. 11 shows a schematic implementation of a STO tuning capacitor into a YBCO resonator utilizing a flip-chip design, as apposed to the hybrid approach of FIG. 10. FIG. 11 shows a Power Supply supplying a voltage V to a voltage regulator for a predetermined period of time. The voltage regulator is comprised of an inductor and capacitor STO-C DIE (an STO capacitor die) configuration, that is coupled to ground GND. The voltage regulator then supplies the varactor with a voltage. The varactor is coupled to a resonator by a coupling element (e.g., a capacitor) COUPLING. As the capacitance of the varactor changes the passband characteristics of the resonator also changes. Also shown is a first transmission line INPUT which delivers signals to the resonator and a second transmission line OUTPUT which delivers signals from the resonator to other circuitry.

The approach depicted in FIG. 9C is well suited to evaluation of the STO films, since the STO capacitors can be changed in a matter of minutes. It is believed that this approach is particularly well suited for an HTS filter product. However, in this approach some modifications to the resonator design are required. More specifically, an additional contact pad is required for the grounding contact. The sizes for the contacts, especially for the pad between the coupling capacitor and the STO capacitor, are important for this approach. In the present application, the pad is selected to be approximately 400 μm by 400 μm. It will be appreciated by those of skill in the art that too small a pad will be difficult to contact, while too large a pad may degrade the performance (e.g., due to parasitic capacitance). However, this approach does not require a bonding wire between the coupling capacitor and the tuning capacitor, and therefore has a better Q-value compated with the first approach. Based on empirical measurements of prototype devices, typically, 10% improvements were observed.

The third approach is a monolithic approach that is illustrated in FIG. 9C. In this approach, the cross-sectional view 901C illustrates that the STO capacitor 930 is first grown onto a substrate 940 in selected regions. This can be accomplished by using a shadow mask, or STO capacitor 930 may be grown and selected regions removed by etching. The YBCO thin film 920 is then grown on the wafer and patterned in such a way as to simultaneously form STO capacitors 930 and couple them into the resonator structure 920. This approach is a more complex process but is preferred for integration into a manufacturing process.

Figure 12A:
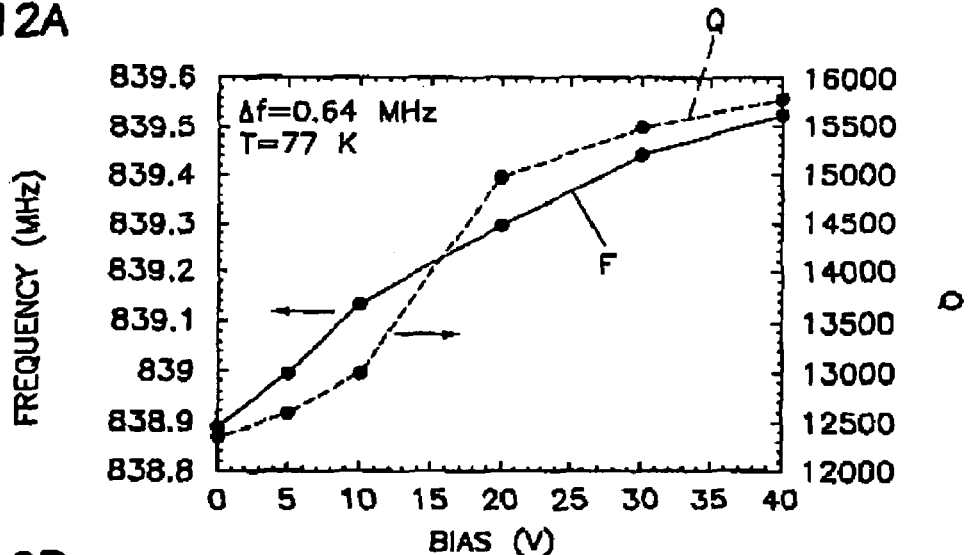
FIGS. 12a, 12b and 12c illustrate the bias dependence of the resonant frequency and Q of a YBCO resonator coupled to a thin film STO, the tuning of $f_0$ and Q for a YBCO resonator coupled to an STO thin film capacitor at the fundamental mode and the response of the latter at the third harmonic mode, respectively.
Figure 12B:
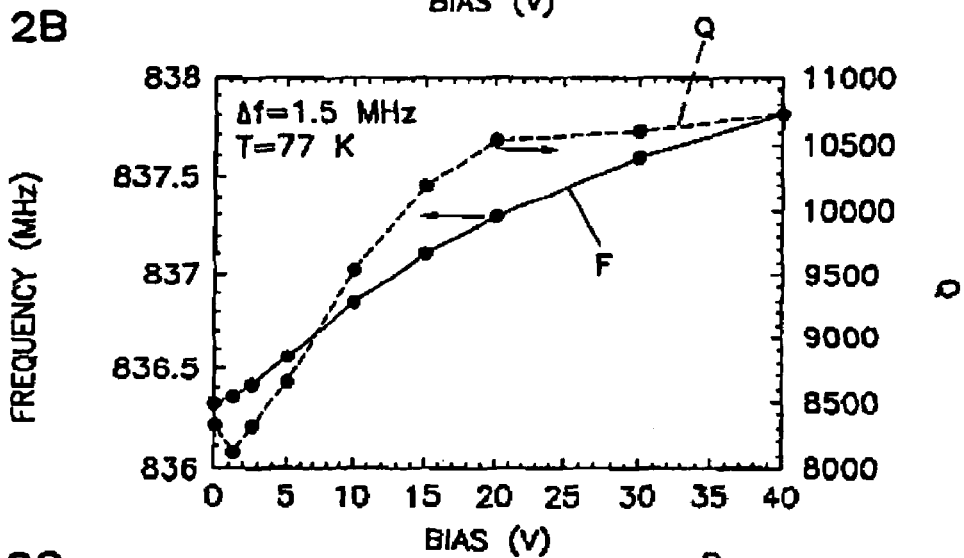
Figure 12C:
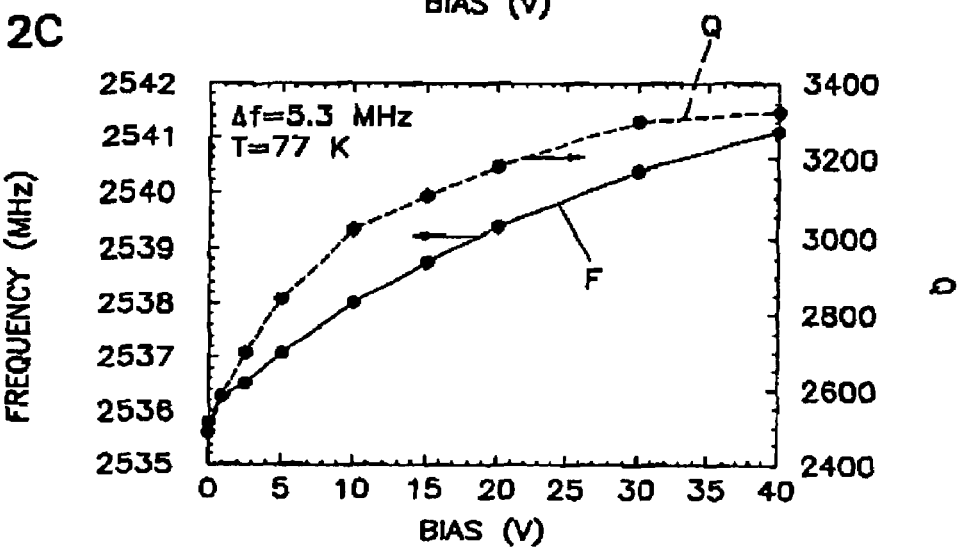

FIGS. 12a, 12b, and 12c show the test results achieved with a flip-chip embodiment. In each of the figures, 12a, 12b, and 12c, the dashed line represents the Q value, Q, and the solid line represents the frequency value, F. FIG. 12a illustrates the case in which a tunable STO capacitor is flip-chip bonded onto a YBCO resonator circuit chip. This resonator had an unloaded Q of 28,000 and a center frequency of about 841 MHz at 77 K. With the applied dc bias voltage, the resonant frequency is tuned to higher values due to the change in the dielectric constant, $\in_r$, of the STO, and the Q also increases as expected because of the decrease in the loss tangent, tan δ, of the STO film. For a bias of 40 V (E<2 V/μm), a frequency shift of 0.64 MHz (0.075%) can be obtained while maintaining a Q of over 15,000.

FIG. 12b displays the performance of another YBCO resonator with greater tuning (Δf=1.5 MHz) and smaller Q. In additional to the fundamental mode at 840 MHz (FIG. 12a), the performance of the $3^{rd}$ harmonic mode at 2.5 GHz is shown in FIG. 13c. The relationship between the fundamental and the $3^{rd}$ harmonic mode is given by $Q_3/Q_1=(f_1/f_3)^2$. Because this resonator was not designed for 2.5 GHz, the Q is expected to be lower at this frequency. However, a Q of over 3,000 can be maintained while tuning by Δf=5.3 MHz (0.2%).

In order to measure the RF properties of the films and to evaluate their suitability for applications, prototype flip-chip tunable STO interdigitated capacitors have been constructed with YBCO lumped-element microwave resonators using approaches intended to minimize the loss. STO films have been produced that are suitable for cryogenic microwave filter applications. At 840 MHz, the performance is similar to state-of-the-art GaAs varactors, while at 2 GHz and above, the performance is superior.

While a particular embodiment to the invention has been described with respect to its application for tuning cooled narrow band filters having capacitance-loaded resonators, it will be understood by those skilled in the art that the invention is not limited by such application or embodiment or the particular circuits disclosed and described herein. Other resonator structures, such as hairpin, lumped element, cavity and combline may be used. It will be appreciated that other circuit configurations that embody the principles of this invention and other applications therefore other than as described herein can be configured within the spirit and intent of this invention. The circuit configuration described herein is provided only as one example of an embodiment that incorporates and practices the principles of this invention. Other modifications and alterations are well within the knowledge of those skilled in the art and are to be included within the broad scope of the independent claims.

The above specification, examples and data provide a complete description of the manufacture and use of the composition of the invention. Since many embodiments of the invention can be made without departing from the spirit and scope of the invention, the invention resides in the claims hereinafter appended.

We claim:
1. A tuning system comprising
   a. a cryogenic cooler;
   b. a cryogenically cooled filtering apparatus contained within the cryogenic cooler, wherein the filtering apparatus comprises
      i. an input end,
      ii. an output end, and
      iii. a plurality of tuning devices, wherein each tuning device comprises
         (1) a respective resonator, and
         (2) a corresponding voltage-sensitive capacitor;
   c. an input line penetrating the cryogenic cooler, wherein a first end of the input line is operatively coupled to the input end of the filtering apparatus, wherein the input line supplies an unfiltered signal to the filtering apparatus;
   d. an output line penetrating the cryogenic cooler, wherein a first end of the output line is operatively coupled to the output end of the filtering apparatus, wherein the output line carries a filtered signal from the filtering apparatus;
   e. a one-to-many switching device comprising
      i. a channel select input port,
      ii. a tuning voltage input port, and
      iii. a plurality of output channels capable of carrying a respective voltage, wherein a respective output channel is coupled to the voltage-sensitive capacitor in a corresponding one of the tuning devices in the filtering apparatus;
   f. a channel select input line penetrating the cryogenic cooler, wherein a first end of the channel select input line is operatively coupled to the channel select input port of the one-to-many switching device; and
   g. a tuning voltage input line penetrating the cryogenic cooler, wherein a first end of the tuning voltage input line is operatively coupled to the tuning voltage input port of the one-to-many switching device, wherein the tuning voltage input line is capable of carrying a voltage which the one-to-many switching device can apply through one of the output channels to the voltage-sensitive capacitor in a corresponding one of the tuning devices coupled to said output channel, wherein the switching device selects the output line based on the signal from the channel select line.

2. The tuning device of claim 1, wherein the respective voltage-sensitive capacitor comprises a corresponding varactor.

3. The tuning system of claim 1, wherein a first input part of a network analyzer is operatively coupled to a second end of the input line and a second input port of the network analyzer is operatively coupled toe second end of the output line.

4. The tuning device of claim 3, wherein an input port of a computer is operatively coupled to an output part of the network analyzer.

5. The tuning device of claim 4, wherein a digital to analog converter is operatively coupled to an output port of the computer by means of a cable interface.

6. The tuning device of claim 5, wherein the digital to analog converter is further operatively coupled to a second end of the tuning voltage input line and a second end of the channel select input line.

7. The tuning device of claim 6, wherein:
   a. the computer passes both a voltage value for each of the voltage-sensitive capacitors in the tuning devices and a corresponding channel select command through the cable interface to the digital to analog converter;

b. the digital to analog converter passes an analog voltage corresponding to a received voltage value through the voltage input line to the one-to-many switching device and passes the corresponding channel select command through the channel select input line to the one-to-many switching device;

c. the one-to-many switching device allows an analog voltage that corresponds to the selected channel to be applied to the tuning device coupled to the selected output channel;

d. the network analyzer monitors the unfiltered signal being supplied to the filtering apparatus and the filtered signal being carried from the filtering apparatus and communicates a corresponding output signal to the computer; and e. the above steps are repeated with new voltage values selected based on the output signal from the network analyzer, thereby effectuating a feedback loop.

8. The tuning device of claim 7, wherein a user may enter the new voltage values into the computer in response to the output signal from the network analyzer.

9. The tuning device of claim 7, wherein a computer program selects the new voltage values in response to the output signal from the network analyzer.

10. The tuning device of claim 1, wherein the one-to-many switching device comprises a one-to-sixteen switch.

11. A method of tuning a filter located within a cryogenic cooler, the filter including an input end penetrating the cryogenic cooler and carrying an unfiltered input signal, an output end penetrating the cryogenic cooler and carrying a filtered output signal, and a plurality of tuning devices, wherein each tuning device comprises a respective resonator and a corresponding voltage-sensitive capacitor, comprising:

a. connecting a one-to-many switching device to the plurality of tuning devices, the one-to-many switching device including a channel select input port, a tuning voltage input port, and a plurality of output channels capable of carrying a respective voltage, wherein a respective output channel is coupled to the voltage-sensitive capacitor in a corresponding one of the tuning devices in the filter;

b. analyzing the unfiltered signal and the filtered signal being carried from the filter for each of the tuning devices, and determining an appropriate voltage to be applied to the voltage sensitive capacitors to filter the signal according to predetermined criteria;

c. transmitting a voltage value for each of the voltage-sensitive capacitors in the tuning devices and a corresponding channel select command to the one-to-many switching device, wherein the voltage values are applied to the corresponding voltage-sensitive capacitors in the tuning devices based on a signal from the channel select line; and d. repeating steps b and c with new voltage values selected based on the unfiltered signal and the filtered signal, thereby effectuating a feedback loop.

12. The method of tuning of claim 11, wherein a network analyzer with an output is used in connection with step b, and further comprising transmitting the output of the network analyzer to a computer, wherein a user may enter the new voltage values into the computer in response to the output signal from the network analyzer.

13. The method of tuning of claim 12, further comprising automatically selecting the new voltage values with the computer in response to the output signal from the network analyzer.

* * * * *